United States Patent
Palmade et al.

(10) Patent No.: US 7,823,322 B2
(45) Date of Patent: Nov. 2, 2010

(54) SILICON CHIP HAVING INCLINED CONTACT PADS AND ELECTRONIC MODULE COMPRISING SUCH A CHIP

(75) Inventors: Romain Palmade, Auriol (FR); Agnes Rogge, Rousset (FR)

(73) Assignee: STMicroelectronics SA, Montrouge (FR)

( * ) Notice: Subject to any disclaimer, the term of this patent is extended or adjusted under 35 U.S.C. 154(b) by 86 days.

(21) Appl. No.: 11/937,972

(22) Filed: Nov. 9, 2007

(65) Prior Publication Data
US 2008/0224320 A1 Sep. 18, 2008

Related U.S. Application Data

(63) Continuation of application No. PCT/FR2006/000669, filed on Mar. 29, 2006.

(30) Foreign Application Priority Data
May 11, 2005 (FR) .................................. 0504710

(51) Int. Cl.
*H01L 21/00* (2006.01)
(52) U.S. Cl. .................. 43/125; 438/126; 438/106; 257/679; 257/732; 257/622; 257/703; 361/761; 361/764; 361/737
(58) Field of Classification Search .......... 257/620, 257/723, 431, 432, 433, 434, 679, 680, E23.064, 257/E23.065, E23.125, E23.176, E23.177, 257/E23.124, 703, 732, 622; 438/113, 116, 438/125, 126, 106; 361/761, 764, 737
See application file for complete search history.

(56) References Cited
U.S. PATENT DOCUMENTS

| 4,719,140 | A  | * | 1/1988 | Hara et al. ................. 428/138 |
| 4,992,847 | A  |   | 2/1991 | Tuckerman |
| 4,999,684 | A  |   | 3/1991 | Temple |
| 6,856,026 | B2 | * | 2/2005 | Yamada et al. .............. 257/774 |
| 6,888,222 | B2 | * | 5/2005 | Shizuno ..................... 257/618 |
| 7,043,830 | B2 | * | 5/2006 | Farnworth ................... 29/842 |
| 7,253,735 | B2 | * | 8/2007 | Gengel et al. ............ 340/572.7 |
| 2002/0047210 | A1 | * | 4/2002 | Yamada et al. .............. 257/774 |
| 2002/0074641 | A1 |   | 6/2002 | Towle et al. |
| 2003/0006493 | A1 |   | 1/2003 | Shimoishizaka et al. |
| 2003/0230805 | A1 |   | 12/2003 | Noma et al. |
| 2004/0183182 | A1 |   | 9/2004 | Swindlehurst et al. |
| 2006/0043514 | A1 | * | 3/2006 | Shizuno ..................... 257/434 |

FOREIGN PATENT DOCUMENTS
FR  2797076  2/2001

* cited by examiner

*Primary Examiner*—Thao X Le
*Assistant Examiner*—Thanh Y Tran
(74) *Attorney, Agent, or Firm*—Lisa K. Jorgenson; Robert Iannucci; Seed IP Law Group PLLC

(57) ABSTRACT

A semiconductor chip has an active face in which an integrated circuit region is implanted. The chip includes an inclined lateral contact pad extending beneath the plane of the active face and electrically linked to the integrated circuit region. An electronic module includes a substrate having a cavity in which the chip is arranged. The module can be applied to the production of thin contactless micro-modules for smart cards and contactless electronic badges and tags.

24 Claims, 4 Drawing Sheets

SILICON CHIP HAVING INCLINED CONTACT PADS AND ELECTRONIC MODULE COMPRISING SUCH A CHIP

BACKGROUND

1. Technical Field

The present invention relates to a method for manufacturing a semiconductor chip and a method for manufacturing an electronic module comprising a substrate, at least one conductive element integral with the substrate and a semiconductor chip.

The present invention particularly relates to the manufacturing of a thin electronic module and more particularly a "contactless"-type module enabling various types of contactless portable objects to be produced, such as contactless smart cards, contactless electronic badges, contactless electronic tags, etc. Such a module can also be inserted into identification objects such as passports or identity cards.

2. Description of the Related Art

An integrated circuit comes in the form of a silicon chip that comprises an active face onto which an integrated circuit region is implanted, forming the actual integrated circuit, and contact pads electrically linked to the integrated circuit region.

An electronic module is produced by electrically linking the contact pads of the chip to one or more conductors integral with an interconnection support, which are themselves linked to other electronic components. However, in the case of a contactless electronic module, the conductor or conductors of the interconnection support are not generally linked to other electronic components (except for passive electric components of capacitor or self-inductance type) but form an antenna circuit interfacing between the integrated circuit and the external environment, for receiving and/or sending data.

The chip is generally mounted bare onto the interconnection support, without previously being arranged in a protection case, and the electric connection of the contact pads with the interconnection support is generally obtained by means of the "chip and wire" technique or the "flip chip" technique. In the first case, the chip is fixed onto the interconnection support with its active face facing upwards, and its contact pads are linked to the conductors of the interconnection support using ultrasonic wire bonding. In the second case, the chip is reverse mounted onto the interconnection support and its contact pads are directly bonded onto corresponding conductive pads of the interconnection support, for example by pressing, applying ultrasonic vibrations, fusion of a material like lead tin or even sticking (by means of an electrically conductive glue).

The mounting of a chip by ultrasonic wiring has the disadvantage that the loops formed by the wires generally have a height greater than the thickness of the chip and increase the total thickness of the micro-module. Furthermore, the wires must be coated in a protection resin that increases the total thickness of the assembly. The "flip-chip" mounting of a chip is therefore often preferred to ultrasonic wiring. However, despite its advantages, the flip-chip technique does not enable electronic modules to be produced with a thickness sufficiently slight to be suitable to all applications, particularly contactless-type modules that are to be integrated into very thin supports (sheet of paper, card or plastic, etc.), despite recent progress in the thinning of chips and the use of new materials (paper, polymers) to form very thin substrates. Another parameter affecting the final thickness of a "flip chip" module is the thickness of the conductive material bumps (or "balls", etc.) which are interposed between the contact pads of the chip and the surface of the interconnection support.

BRIEF SUMMARY

One embodiment is a semiconductor chip structure enabling thin electric connections to be produced between the chip and an interconnection support.

Another embodiment is a thin electronic module comprising such a chip.

One embodiment is a chip having inclined lateral contact pads which extend beneath a plane passing by the active face of the chip. Such contact pads can be laterally connected to a conductive element of an interconnection support, by means of a conductive material that does not have any excessive thickness relative to the plane of the active face of the chip. Thus, the electric connection between the chip and an interconnection support does not increase the thickness of an electronic module produced by means of such a chip.

One embodiment arranges the chip in a cavity made in the interconnection support, so that a part of the thickness of the chip is included in the thickness of the support. The conductors of the interconnection support are then substantially at the same level as the contact pads of the chip and can be linked to them by a simple thin conductive bridge.

One embodiment provides a method for manufacturing at least one semiconductor chip, comprising a step of implanting an integrated circuit region onto an active face of the chip. The method comprises:

a step of producing on the chip at least one inclined edge extending between the active face and a lateral face of the chip, and a step of manufacturing, on the inclined edge, an inclined lateral contact pad electrically linked to the integrated circuit region and extending beneath the plane of the active face of the chip.

According to one embodiment of the present invention, the lateral contact pad is produced by depositing a layer of an electrically conductive material extending from the inclined edge to the active face of the chip and covering a contact pad situated in the integrated circuit region.

According to one embodiment of the present invention, the lateral contact pad is produced by depositing a layer of an electrically conductive material extending from the inclined edge to the active face of the chip where it penetrates the integrated circuit region to be linked thereto.

According to one embodiment of the present invention, the inclined edge is produced by forming a flared scribe line with inclined walls in a semiconductor wafer, then by cutting out at least one edge of the chip in the wafer along the scribe line.

According to one embodiment of the present invention, the method comprises the following steps:

implanting a plurality of integrated circuit regions into a semiconductor wafer, producing scribe lines in the wafer which pass between the integrated circuit regions, depositing an electrically conductive material on the semiconductor wafer so as to form strips that link the integrated circuit regions two by two and that cross the scribe lines, and cutting out the wafer along the scribe lines.

According to one embodiment of the present invention, the method comprises a step of thinning the semiconductor wafer before cutting it out.

One embodiment is a semiconductor chip, comprising an active face on which an integrated circuit region is implanted.

The chip comprises at least one inclined lateral contact pad extending beneath the plane of the active face of the chip and electrically linked to the integrated circuit region.

According to one embodiment of the present invention, the inclined lateral contact pad is formed by an electrically conductive material which extends up to the active face of the chip and covers a contact pad of the integrated circuit region.

According to one embodiment of the present invention, the inclined lateral contact pad is formed by an electrically conductive material which extends up to the active face of the chip where it is electrically linked to the integrated circuit region.

One embodiment is a method for manufacturing an electronic module comprising a substrate, at least one conductive element integral with the substrate and a chip as defined above comprising at least one inclined lateral contact pad. The method comprises the following steps:

making a cavity in the substrate,
   inserting the chip into the cavity, and
   electrically linking the inclined lateral contact pad to the conductive element.

According to one embodiment of the present invention, the method comprises a step of depositing, in the cavity, a substance for fixing the chip.

According to one embodiment of the present invention, the method comprises a step of producing a conductive bridge between the inclined lateral contact pad and the conductive element, by depositing a conductive substance.

According to one embodiment of the present invention, the substance forming the conductive bridge is deposited so as not to have any excessive thickness extending above the plane of the active face of the chip.

According to one embodiment of the present invention, the method comprises a step of simultaneously producing the conductive element and the conductive bridge.

According to one embodiment of the present invention, the cavity is made by a forming treatment of the substrate.

According to one embodiment of the present invention, the cavity is made by forming the substrate by assembling at least two layers of a material, one layer forming the bottom of the cavity and the other layer comprising an orifice delimiting the walls of the cavity.

One embodiment is an electronic module comprising a substrate, at least one conductive element integral with the substrate and a semiconductor chip comprising an active face on which an integrated circuit region is implanted. In the module:

the substrate comprises a cavity in which the chip is arranged,
   the chip comprises at least one inclined lateral contact pad extending beneath the plane of the active face of the chip, and
   the inclined lateral contact pad is electrically linked to the conductive element.

According to one embodiment of the present invention, the chip is held in the cavity by a fixing substance.

According to one embodiment of the present invention, the inclined lateral contact pad is substantially in a same plane as an edge of the cavity.

According to one embodiment of the present invention, the module comprises, between the inclined lateral contact pad and the conductive element, a conductive bridge formed by a conductive substance that does not comprise any excessive thickness extending above the plane of the active face of the chip.

According to one embodiment of the present invention, the conductive element forms an antenna.

BRIEF DESCRIPTION OF THE SEVERAL VIEWS OF THE DRAWINGS

These and other features and advantages will be presented in greater detail in the following description of an example of an embodiment of a chip according to the present invention and of an example of an embodiment of an electronic module according to the present invention, given in relation with, but not limited to the attached figures, wherein.

DETAILED DESCRIPTION

Figure 1A:
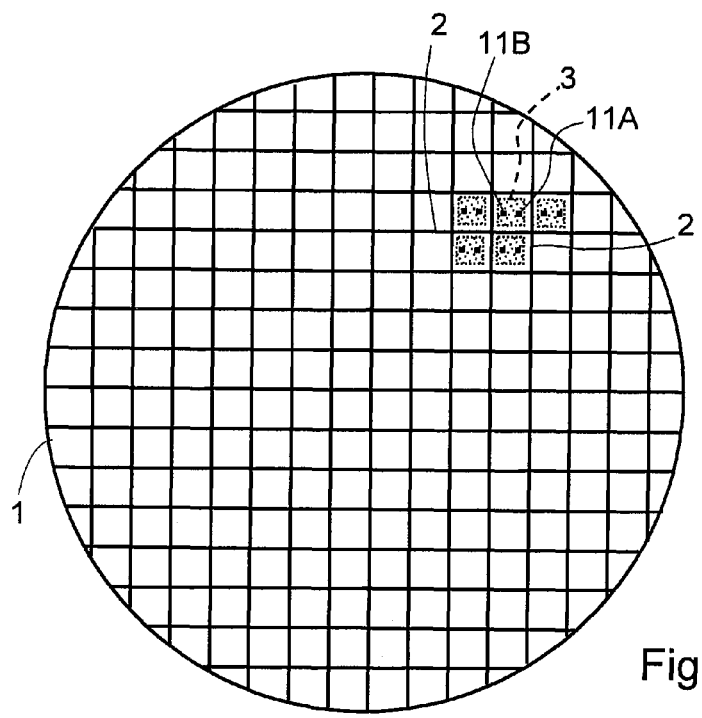
FIG. 1A is a top view of a silicon wafer on which integrated circuits are collectively produced.
Figure 1B:
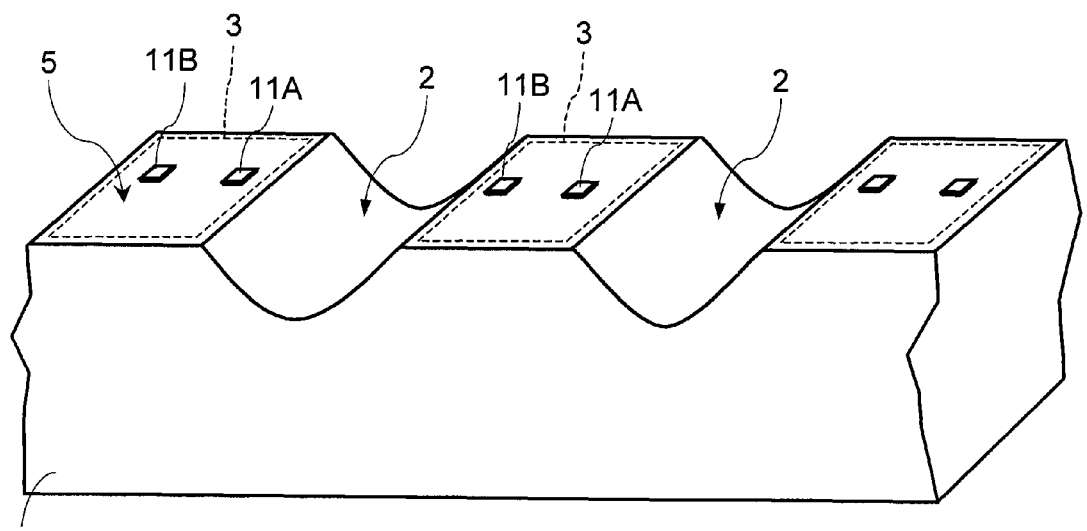
FIG. 1B is a perspective sectional view of one portion of the silicon wafer in FIG. 1.

FIGS. 1A, 1B, 2 and 3 show a method for manufacturing a chip according to one embodiment. FIG. 1A represents a silicon wafer 1 seen from above and FIG. 1B represents a portion of the wafer 1 seen in section and in perspective. The wafer 1 receives a plurality of integrated circuit regions 3 collectively implanted into the silicon in a classical manner. The integrated circuit regions 3 are delimited by vertical and horizontal scribe lines 2, along which the wafer 1 will subsequently be cut to separate the integrated circuit regions and to obtain individual integrated circuits in the form of chips.

After implanting the integrated circuit regions 3, contact pads 11A, 11B are generally formed which are linked to the regions 3 through orifices passing through a protection layer deposited on the entire surface of the silicon wafer. In the example represented in the Figures, each integrated circuit region receives two contact pads 11A, 11B intended for example to be connected to the terminals of an antenna coil. These contact pads 11A, 11B are produced classically, by depositing metal via a metallization mask in the presence of a metal vapor or by chemically plating and etching a metal layer for example.

The scribe lines 2 have the shape of grooves with a flared profile having inclined walls, and extend over one part of the thickness of the wafer 1. Classically, the wafer 1 has a thickness of a few hundred micrometers and the scribe lines 2 have a depth in the order of a few micrometers—typically 5 μm—and a width in the order of 60 to 100 micrometers. The slope of the groove at its edges is for example in the order of 135° in relation to the upper face of the wafer 1. These scribe lines are produced by sawing, dry etching or laser etching, or any other method enabling grooves with inclined walls to be produced.

Figure 2:
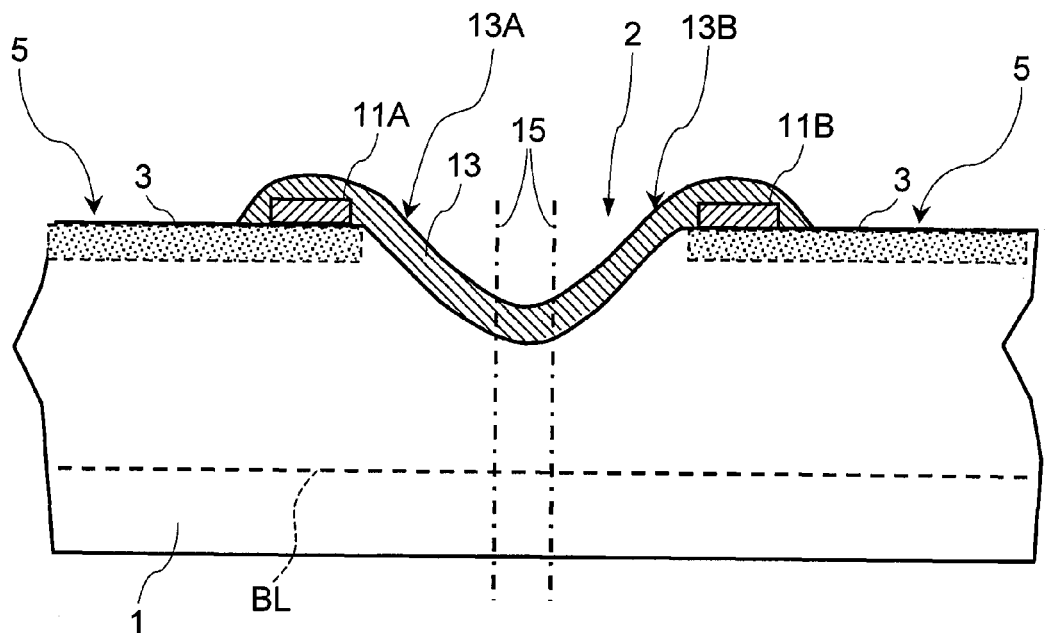
FIG. 2 is a cross-section of one portion of the silicon wafer in FIG. 1, and shows a step of a method for manufacturing chips according to one embodiment.

During a step shown in FIG. 2, electrically conductive pads 13A, 13B are formed on the inclined edges of the scribe lines 2, adjacent to each contact pad 11A, 11B. These pads 13A, 13B are intended to form lateral contacts on the future chips.

To link each pad 13A, 13B to the corresponding contact pad 11A, 11B, and in order to avoid a subsequent interconnection step, the pads 13A, 13B advantageously extend up to the pads 11A, 11B and cover the latter, thus ensuring optimal electrical contact with the same.

The pads 13A, 13B in the form of strips are produced by depositing a conductive material 13. This step first of all comprises forming a classical metallization mask, by covering the upper face of the wafer 1 with a layer of photosensitive polymer that is insulated then developed to open windows corresponding to the zones that are to receive the conductive material 13. The conductive material 13 is then deposited by any appropriate method, particularly ion or chemical plating, or by depositing an electrically conductive ink.

The conductive material 13 is obviously deposited after first having deposited an insulating layer on the scribe lines (not represented) so as to electrically insulate the conductive material 13 from the silicon.

Advantageously, the metallization mask comprises metallization windows extended so as to form conductive strips that pass through the scribe lines and link contact pads which belong to different integrated circuit regions but which are opposite one another. Thus, as represented in FIG. 2, the pad 11A of an integrated circuit region 3 is linked to the pad 11B of another integrated circuit region 3 by a conductive strip 13 that passes through the scribe line.

As it can be seen in the Figure, the conductive material 13 does not entirely fill the groove, but follows the shape thereof, such that the upper face of the conductive strips have an angle of inclination substantially identical to that of the inclined edges of the groove.

The wafer 1 is then cut out along the central part of the scribe lines 2, marked by dotted lines 15 on FIG. 2, so as not to destroy the inclined walls of the scribe lines or, at least so as not to destroy the part of the inclined walls the closest to the integrated circuit regions. The operation is conducted classically, by sawing, chemical etching or by laser, etc.

Figure 3:
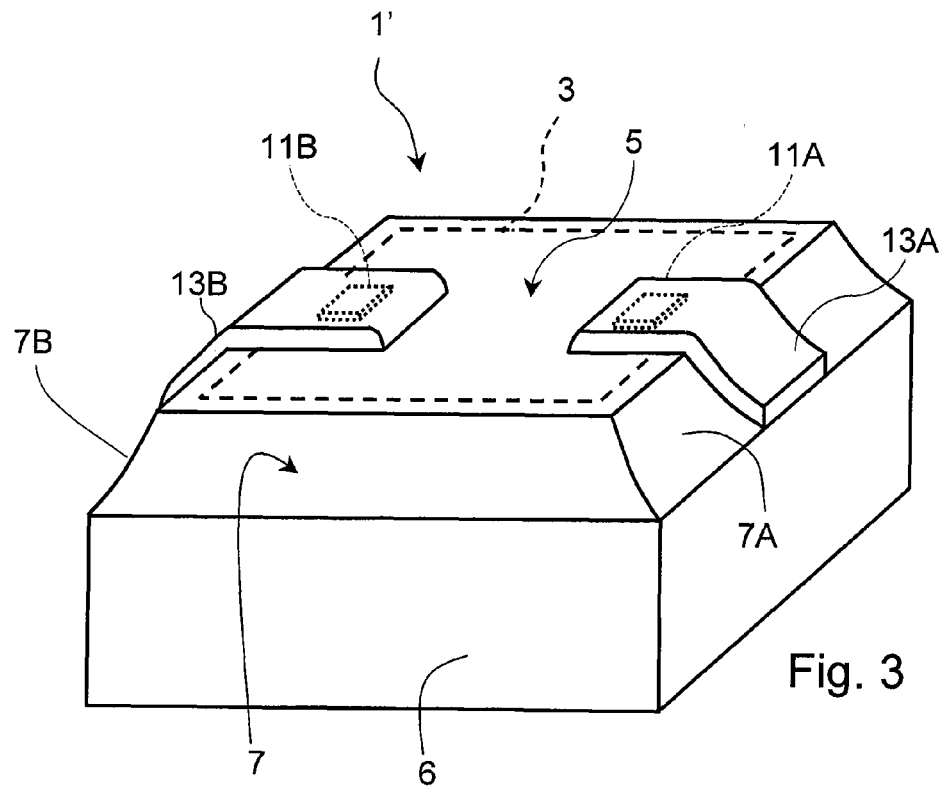
FIG. 3 is a perspective view of a chip according to one embodiment after the silicon wafer in FIG. 1 has been cut out.

FIG. 3 represents a chip 1' according to the present invention obtained after cutting out the wafer 1. The chip 1' has four lateral faces 6, here vertical, four inclined edges 7, and an upper face or active face 5 in which the integrated circuit region 3 and the contact pads 11A, 11B are located. The inclined edges 7 correspond to the walls of the scribe lines and extend between the lateral faces 6 and the active face 5, and they form bevel edges or chamfers.

The conductive strips 13 that originally linked the contact pads of the adjacent integrated circuit regions have been sectioned during the cutting out of the wafer 1 and now form two contact pads 13A, 13B which respectively cover the contact pads 11A, 11B and respectively extend over two inclined edges 7A, 7B of the chip 1'.

In one advantageous embodiment, the portions of the contact pads 13A, 13B covering the inclined edges 7A, 7B are laterally widened to obtain a greater connection surface area.

Prior to cutting out the wafer 1, the latter can undergo a thinning step, by chemical and/or mechanical abrasion of its rear face for example. The thickness of the wafer can thus be reduced to a value below 100 µm, and advantageously in the order of 50 µm.

In one alternative embodiment of the method described above, the contact pads 11A, 11B of the integrated circuit regions and the inclined pads 13A, 13B are manufactured simultaneously during a single step of depositing metal through a metallization mask or by depositing a metal layer and etching the metal layer using an etching mask. The contact pads 11A, 11B of the integrated circuit regions and the inclined pads 13A, 13B are then merged and formed by one and the same material.

However, a same session of manufacturing a batch of silicon wafers can concern several thousand chips intended for different applications; some may be intended to be classically connected to an interconnection support. In these conditions, the silicon wafers are produced classically and the ones intended to receive the pads 13A, 13B are isolated from the batch after the final manufacturing step, the pads 13A, 13B then being "post-manufactured" by covering the initial contact pads 11A, 11B in the manner described above.

Thanks to the inclined lateral contacts 13A, 13B, the chip 1' can be electrically connected to conductors of an interconnection support by a simple horizontal "bridge"-type electric link, as will be described below, without any excessive thickness relative to the plane passing by the active face of the chip.

Such a chip 1' can therefore be intended for various purposes and enables, in particular, a thin electronic module to be produced on any type of interconnection support, particularly made of paper, plastic, polymer, textile, ceramic, epoxy, etc.

An example of an embodiment of such an electronic module will now be described.

Figure 4A:
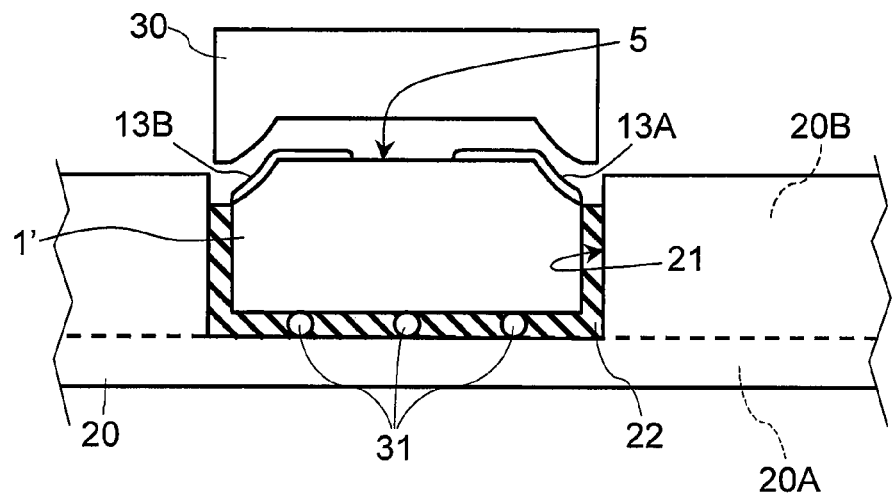
FIGS. 4A and 4B are cross-sections showing a method for manufacturing an electronic module according to one embodiment.

As shown in FIG. 4A, the module is produced using an interconnection support or substrate 20 made of a flexible substance in which a cavity 21 of slightly greater dimensions than those of the chip 1' has been made. The cavity 21 has here been made by embossing a layer of flexible material, or by thermoforming. As represented by dotted lines, it can also be made by assembling a lower layer 20A forming the bottom of the cavity 21 and an upper layer 20B comprising an orifice formed by punching, delimiting the lateral walls of the cavity 21.

During a step shown in FIG. 4A, a fixing substance is deposited in the cavity 21, such as a polymer glue 22 for example. The chip 1' is then inserted into the cavity and is pressed by means of an adapted tool 30, the substrate and the chip 1' possibly being heated to speed up the polymerization of the glue. At the end of this step, the active face 5 of the integrated circuit is substantially in the plane of the upper face of the substrate 21.

During the pressing of the chip 1, it is desirable to prevent the glue from covering the contact pads 13A, 13B of the chip. To this end, the glue that comes out of the cavity 21 is for example absorbed by means of blotting paper. Another solution is to arrange spacers 31 at the bottom of the cavity before inserting the chip 1', such as ball-shaped spacers for example, to control the thickness of the layer of glue at the bottom of the cavity and to avoid any excessive fouling of the chip that would force the glue out of the cavity.

Unlike the "flip-chip" technique, it is not therefore necessary to turn the chip 1' over before inserting it into the cavity 21 and the manufacturing process is thus simplified.

Figure 4B:
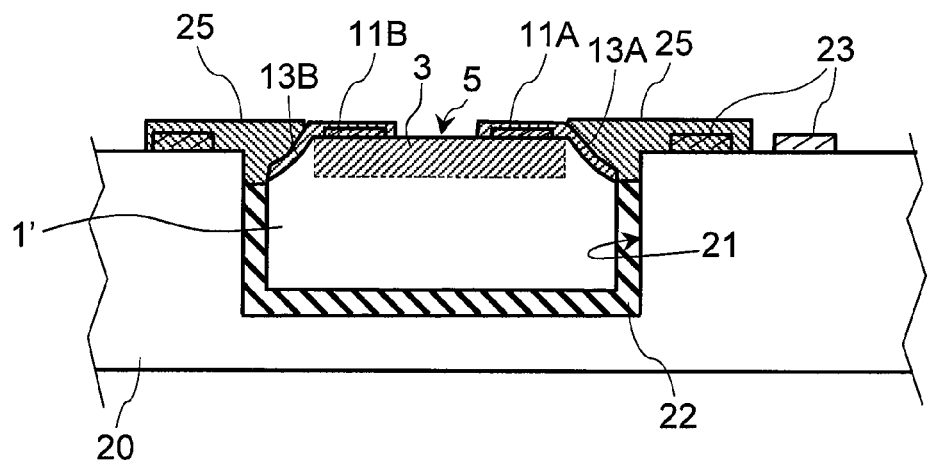

During a step shown in FIG. 4B, the contact pads 13A, 13B of the chip 1' are electrically linked to a conductive element 23 that has first been formed on the surface of the substrate 20. This operation is performed by making a conductive bridge 25 between the contact pads 13A, 13B and the conductive element 23. The conductive bridge 25 is for example made by depositing a conductive substance that passes above the gap filled with glue extending between the walls of the cavity 21 and the inclined edges of the chip 1'. The conductive substance can be any classical material used in microelectronics, such as an ink, a paste or an electrically conductive glue.

The chip 1' is for example a PICC-type contactless integrated circuit as described by ISO standard 14443. In this case, the conductive element 23 is an antenna coil formed on the upper face of the substrate 21 or formed inside it and having ends extending to the surface of the substrate up to the chip 1'. Such an antenna coil can classically have a plurality of coplanar loops surrounding the chip 1'. The chip 1' can also be a UHF contactless integrated circuit and the conductive element 23 can be a UHF antenna without any winding.

Figure 5:
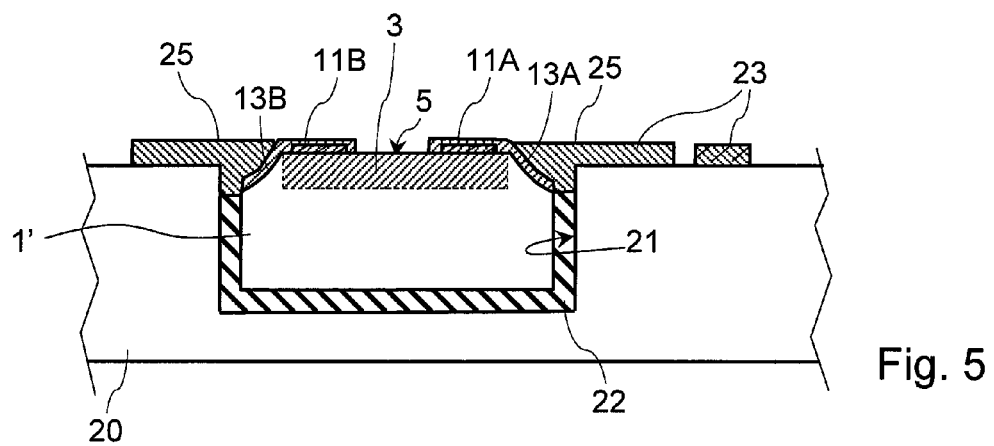
FIG. 5 is a cross-section showing an electronic module according to an alternative embodiment.

In one alternative embodiment of the module, shown in FIG. 5, the conductive element 23 is produced at the same time as the bridge 25, in a single step of depositing a conductive substance 25. The electrically conductive ink-jet techniques with a twin-headed system can for example be used to this end. A technique can also be applied of winding an insulated copper wire using an inclined thermode.

Compared to classical methods of manufacturing electronic modules, the method enables the total thickness of the module formed by the integrated circuit and its interconnection support to be reduced by 5 to 10%. It thus enables an electronic module to be produced the thickness of which is less than about a hundred micrometers and in which an integrated circuit is embedded. Furthermore, the module produced is much more solid than modules using ultrasonic wire bonding, which must, moreover, be protected by an insulating material.

It will be noted that the various steps of the method described above, particularly the steps of mounting, assembling, connecting or producing contact pads or conductors, can be implemented using techniques widely used in the microelectronics industry.

It will be understood by those skilled in the art that various alternative embodiments of the chip according to the present invention and the electronic module produced using such a chip are possible. In particular, the inclined edges of the chip can be obtained by applying an abrasive treatment to the chips after they have been separated from the wafer, independently of forming the scribe lines 2 on the wafer.

The connection method can also be applied to the interconnection of at least two chips arranged side by side so that their inclined contact pads are opposite one another. Once the two integrated circuits are fixed onto a support, the gap between the chips is filled with an electrically conductive material ensuring the interconnection of the inclined contact pads. It is also possible to pre-fill this gap with an insulating material, before depositing the conductive substance.

Furthermore, it will be understood that the present invention applies to all types of chip, particularly to chips made from another semi-conductive material, such as chips made from gallium arsenide AsGa for example.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    manufacturing a semiconductor chip, the manufacturing including:
        implanting an integrated circuit region into an active top face of the chip;
        producing on the chip an upper inclined edge extending between the active top face and a lateral face of the chip, the lateral face extending from a bottom portion of the upper inclined edge to a bottom face of the chip; and
        manufacturing, on the upper inclined edge, an inclined lateral contact pad electrically linked to the integrated circuit region and extending beneath a plane of the active top face of the chip;
    forming a cavity in a substrate, the cavity extending from a surface of the substrate into the substrate;
    forming a conductive element on the surface of the substrate;
    inserting the semiconductor chip into the cavity to an extent in which at least a portion of the inclined lateral contact pad is positioned in the cavity; and
    forming a conductive bridge that contacts the conductive element on the surface of the substrate and the inclined lateral contact pad, a portion of the conductive bridge being positioned in the cavity.

2. The method according to claim 1, wherein the inclined lateral contact pad is produced by depositing a layer of an electrically conductive material extending from the inclined edge to the active face of the chip and covering a contact pad situated in the integrated circuit region.

3. The method according to claim 1, wherein the inclined lateral contact pad is produced by depositing a layer of an electrically conductive material extending from the inclined edge to the active face of the chip where the layer of electrically conductive material penetrates the integrated circuit region.

4. The method according to claim 1, wherein the inclined edge is produced by forming a flared scribe line with inclined walls in a semiconductor wafer, then by cutting out an edge of the chip in the wafer along the scribe line.

5. The method according to claim 1, comprising:
    implanting a plurality of integrated circuit regions into a semiconductor wafer;
    producing scribe lines in the wafer which pass between the integrated circuit regions;
    depositing an electrically conductive material on the semiconductor wafer so as to form strips that link the integrated circuit regions two by two and that cross the scribe lines; and
    cutting the wafer along the scribe lines.

6. The method according to claim 5, comprising a step of thinning the semiconductor wafer before cutting it.

7. The method according to claim 1, wherein the conductive element is positioned directly on a top surface of the substrate and the conductive bridge is positioned directly on a top surface of the conductive element.

8. The method according to claim 1, further comprising:
    forming a spacer on a bottom of the cavity; and
    forming an adhesive layer on the bottom of the cavity, the adhesive layer adhering the semiconductor chip to the substrate and the spacer defining a thickness of the adhesive layer.

9. A method, comprising:
manufacturing an electronic module, the manufacturing including:
making a cavity in a substrate;
making a conductive element integral with the substrate; and
making a semiconductor chip having an active top face, the making the semiconductor chip including:
implanting an integrated circuit region in the active top face; and
producing on the chip an upper inclined edge extending between the active top face and a lateral face of the chip, the lateral face extending from a bottom portion of the upper inclined edge to a bottom face of the chip; and
making, on the upper inclined edge, an inclined lateral contact pad, extending beneath a plane of the active top face of the chip and electrically linked to the integrated circuit region;
inserting the semiconductor chip into the cavity to an extent in which at least a portion of the inclined lateral contact pad is positioned in the cavity; and
producing a conductive bridge electrically linking the inclined lateral contact pad to the conductive element, a portion of the conductive bridge being positioned in the cavity.

10. The method according to claim 9, comprising depositing, in the cavity, an adhesive substance that affixes the chip to the substrate.

11. The method according to claim 9, wherein producing the conductive bridge includes depositing a conductive substance on the inclined lateral contact pad and on the conductive element.

12. The method according to claim 11, wherein producing the conductive element is performed simultaneously with producing the conductive bridge.

13. The method according to claim 11, wherein producing the conductive bridge includes depositing the conductive substance so as not to have any thickness of the conductive bridge extending above an uppermost plane of the inclined lateral contact pad.

14. The method according to claim 9, wherein the cavity is made by a forming treatment of the substrate.

15. The method according to claim 9, further comprising making the substrate by assembling at least two layers, one layer forming a bottom of the cavity and the other layer comprising an orifice delimiting walls of the cavity.

16. The method according to claim 9, wherein the conductive element is positioned directly on a top surface of the substrate and the conductive bridge is positioned directly on a top surface of the conductive element.

17. The method according to claim 9, further comprising:
forming a spacer on a bottom of the cavity; and
forming an adhesive layer on the bottom of the cavity, the adhesive layer adhering the semiconductor chip to the substrate and the spacer defining a thickness of the adhesive layer.

18. An electronic module, comprising:
a substrate having a cavity;
a conductive element integral with the substrate;
a semiconductor chip having an active top face with an integrated circuit region, the chip including an upper inclined edge extending between the active top face and a lateral face of the chip, the lateral face extending from a bottom portion of the upper inclined edge to a bottom face of the chip;
an inclined lateral contact pad positioned on the upper inclined edge and extending beneath a plane of the active top face of the chip, the semiconductor chip, including at least a portion of the inclined lateral contact pad, being positioned in the cavity and having an upper inclined edge extending between the active top face and a lateral face of the chip, the lateral face extending from a bottom portion of the upper inclined edge to a bottom face of the chip; and
a conductive bridge electrically linking the conductive element with the integrated circuit region via the inclined lateral contact pad, a portion of the conductive bridge being positioned in the cavity.

19. The module according to claim 18, wherein the chip is held in the cavity by an adhesive substance.

20. The module according to claim 18, wherein the inclined lateral contact pad is substantially in a same plane as an edge of the cavity.

21. The module according to claim 18, wherein a top surface of the conductive bridge does not extend above a top plane of the inclined lateral contact pad.

22. The module according to claim 18, wherein the conductive element is an antenna.

23. The module according to claim 18, wherein the conductive element is positioned directly on a top surface of the substrate and the conductive bridge is positioned directly on a top surface of the conductive element.

24. The module according to claim 18, further comprising:
a spacer positioned on a bottom of the cavity; and
an adhesive layer positioned on the bottom of the cavity and adhering the semiconductor chip to the substrate, the spacer defining a thickness of the adhesive layer.

* * * * *